United States Patent [19]

Hata et al.

[11] 4,060,773
[45] Nov. 29, 1977

[54] FREQUENCY MODULATION SYSTEM

[75] Inventors: Masaaki Hata, Hino; Sotaro Wada, Hachioji, both of Japan

[73] Assignee: Tokyo Shibaura Electric Co., Ltd., Kawasaki, Japan

[21] Appl. No.: 761,813

[22] Filed: Jan. 24, 1977

[30] Foreign Application Priority Data

Jan. 28, 1976 Japan .................................. 51-7531

[51] Int. Cl.$^2$ .............................................. H03C 3/00
[52] U.S. Cl. .......................................... 332/19; 331/2
[58] Field of Search ................. 332/19; 331/2, 22, 30, 331/31

[56] References Cited

U.S. PATENT DOCUMENTS

| | | | |
|---|---|---|---|
| 2,958,768 | 11/1960 | Brauer | 332/19 |
| 3,319,178 | 4/1967 | Broadhead, Jr. | 331/2 |
| 3,361,986 | 1/1968 | Catania | 332/19 |
| 3,414,842 | 12/1968 | Broadhead, Jr. | 332/19 |

Primary Examiner—John Kominski

Attorney, Agent, or Firm—Oblon, Fisher, Spivak, McClelland & Maier

[57] ABSTRACT

An output frequency of a first variable frequency oscillator is frequency-divided and the frequency divided signal is compared in phase with the output frequency of a reference frequency oscillator. The result of the phase comparing is fed back to the first variable frequency oscillator for controlling the output frequency of the first variable frequency oscillator. The output frequency of a second variable frequency oscillator is mixed with the output frequency of a fixed frequency oscillator to produce a difference frequency between both output frequencies. The difference frequency is compared in phase with the output frequency of the first variable frequency oscillator. The result of the phase comparing is used for controlling the output frequency of the second variable frequency oscillator. The output frequency of the fixed frequency oscillator is frequency-modulated by the frequency of a modulating signal.

5 Claims, 2 Drawing Figures

FREQUENCY MODULATION SYSTEM

BACKGROUND OF THE INVENTION

The present invention relates to a frequency modulation system capable of stably frequency-modulating output frequencies of a variable frequency oscillator.

A multi-channel FM transmitter includes a variable frequency oscillator. The variable frequency oscillator must generate the center frequencies of the respective channel FM transmission waves so that the oscillation frequency of the variable frequency oscillator must be controlled in a relatively wider range as the number of channels increases, Generally, it is difficult to stably frequency-modulate such a wide range of fruencies. In a conventional FM transmitter, the output frequency of the variable frequency oscillator is frequency-modulated by means of a FM modulator and then the resulted FM wave is multiplied until the desired modulation index is obtained. This conventional scheme, however, is defect in that it is difficult to frequency-modulate with uniform stability such a wide range of frequencies and the occurrence of spurious components is inevitable at the frequency division stage.

Accordingly, an object of the present invention is to provide a frequency modulation system in which, even if a variable frequency oscillator produces a wide range of frequencies, the output frequencies may be easily and stably frequency-modulated without producing the sprious components or frequencies.

SUMMARY OF THE INVENTION

The present invention may be briefly summarized as involving a frequency modulation system comprising: a first means including a first variable frequency oscillator, a frequency divider for dividing the output frequency of the first variable frequency oscillator, a reference frequency oscillator, and a first feedback circuit in which the output frequency of the reference frequency oscillator is compared in phase with that of the frequency divider and the result of the phase comparing is fed back to the first variable frequency oscillator through a first filter for conrolling the output frequency of the first variable frequency oscillator; a second means including a second variable frequency oscillator, a fixed frequency oscillator, means in which the output frequencies of the second variable frequency oscillator and of the fixed frequency oscillator are mixed in a mixer thereby to obtain a difference frequency between both frequencies, and a second feedback circuit in which the difference frequency is compared in phase with the output frequency of the first variable frequency oscillator and the result of the phase comparing is fed back to the second variable frequency oscillator through a second filter for controlling the output frequency of the second variable frequency oscillator; and third means in which the output frequency of the fixed frequency oscillator is frequency-modulated by the frequency of a modulating signal thereby to obtain a frequency-modulated wave from the seond variable frequency oscillator.

In the present invention, the first means is comprised of a first phase synchronizing circuit, and the second means comprises a second phase synchronizing circuit. In the second phase synchronizing circuit, it is easy to stably frequency-modulate the output of the fixed frequency oscillator. As a result, it is easy to stably frequency-modulate a relatively wide range of frequencies from the second variable frequency oscillator in the second phase synchronizing circuit. Moreover, the frequency modulation circuit eliminates necessities that the non-modulated output of the variable frequency oscillator in the second synchronizing circuit is taken out to the outside of the synchronizing circuit and the non-modulated output taken out is frequency-modulated and then the frequency-modulated signal is multiplied. Therefore, the present invention attains a frequency-modulated wave which is stable and includes no spurious components. The use of the first and second phase synchronizing circuits provides a FM signal with an extremely stable center frequency.

Other objects and features of the present invention will be apparent from the following description, taken in connection with the accompanying drawings, in which:

DETAILED DESCRIPTION OF THE PREFERRED EMBODIMENTS

Figure 1:
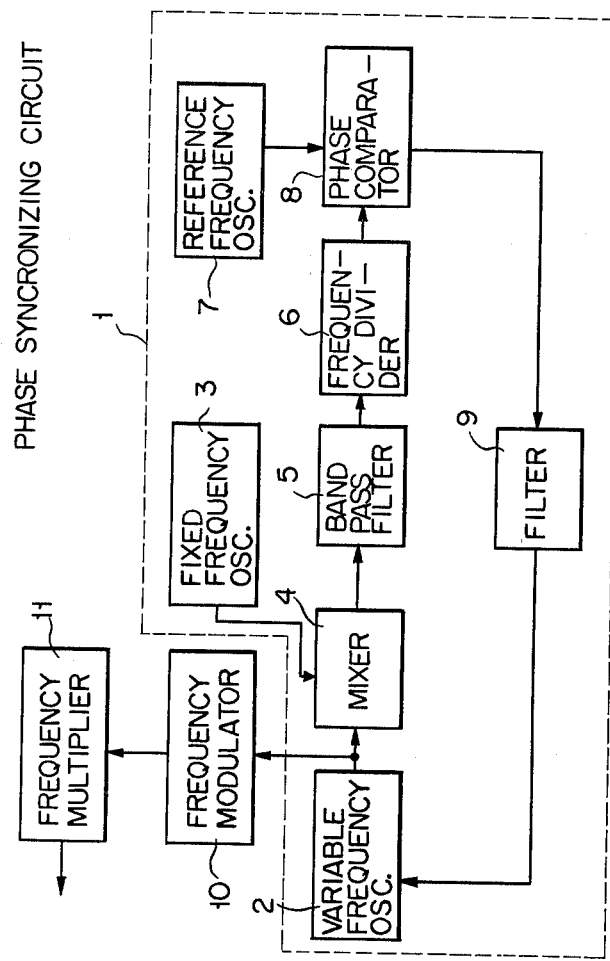
FIG. 1 shows a block diagram of a conventional frequency modulation system.

Before proceeding with description of the present invention, reference will be made to FIG. 1 illustrating a conventional frequency modulation system, for easy of understanding of the present invention. A phase synchronizing circuit 1 is comprised of a variable frequency oscillator 2, a stable fixed frequency oscillator 3, a mixer 4, a band pass filter 5, a frequency divider 6, a reference frequency oscillator 7, a phase comparator 8 and a filter 9. The mixer 4 produces only the difference between the output frequencies from the variable frequency oscillator 2 and the fixed frequency oscillator 3. The difference frequency from the mixer 4 is filtered by the band pass filter 5 and then is frequency-divided in the frequency divider 6. The outputs from the divider 6 and from the reference frequency oscillator 7 are compared in phase in the phase comparator 8 the output of which is fed back to the variable frequency oscillator 2, through the filter 9. Accordingly, the output frequency of the variable frequency oscillator 2 is controlled in accordance with the division ratio of the frequency divider 6. The output signal of the variable frequency oscillator 2 is modulated at the outside of the phase synchronizing circuit 1 and its modulated wave is frequency-multiplied in the frequency multiplier 11. Therefore, there are possibilities that the stability of the modulation is deteriorated and spurious frequencies are produced. Further, note that, in the modulation system of this kind, the output frequency of the reference frequency oscillator 7 is set to substantially be equal to the band frequency of the modulating signal in the frequency modulator 10 so that the cut-off frequency of the filter 9 is inevitably low. The theory of the phase synchronizing circuit leads to the conclusion that it is impossible to frequency-modulate any of components in the phase synchronizing circuit 1.

Figure 2:
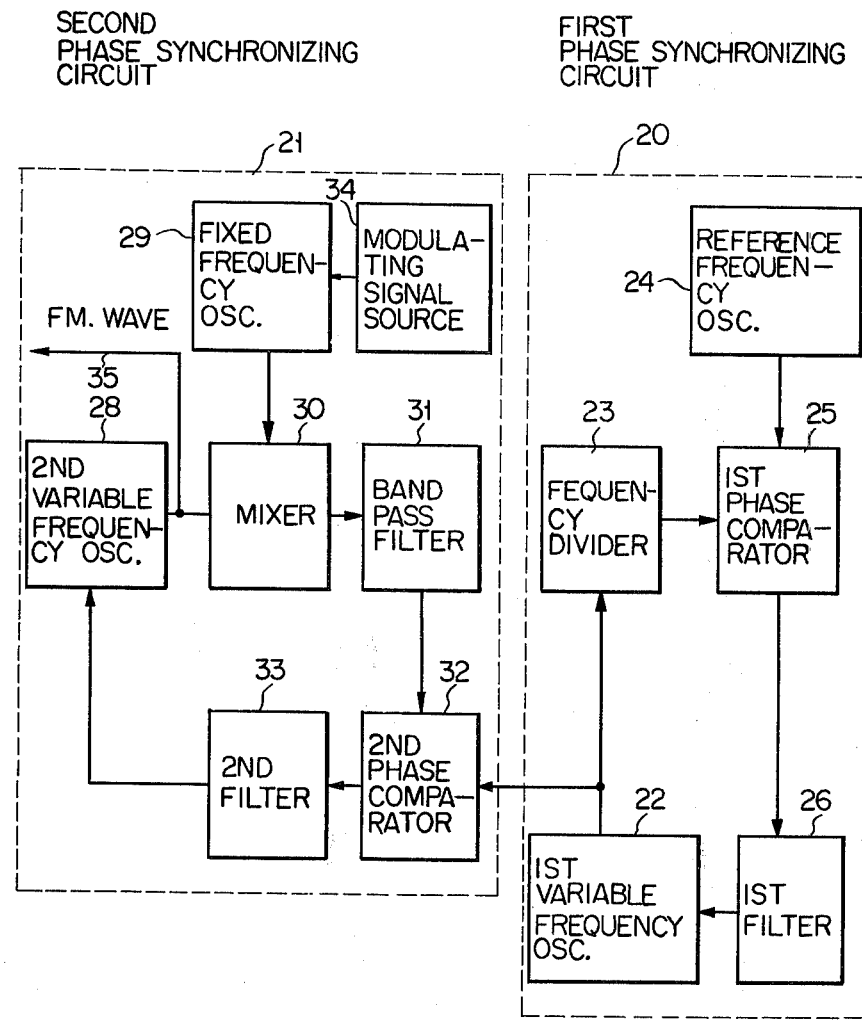
FIG. 2 shows a block diagram of an embodiment of a frequency modulation system according to the present invention.

Referring now to FIG. 2, there is shown an embodiment of a frequency modulation system according to the present invention. In the figure, reference numeral 20 designates a first phase synchronizing circuit, and 21 a second phase synchronizing circuit. The output frequency of the first variable frequency oscillator 22 in the first phase synchronizing circuit 20 is frequency-divided in a frequency divider 23. A first phase comparator 25 compares the phase of the output frequency of the frequency divider 23 with that of a reference frequency oscillator 24. The output of the phase comparator 25 is fed back to the variable frequency oscillator 22, through a first filter 26. Accordingly, the output frequency of the variable frequency oscillator 22 is controlled such that the output frequency of the frequency divider 23 is equal to that of the reference frequency oscillator 24.

In the second phase synchronizing circuit 21, the output frequency of a second variable frequency oscillator 28 is mixed with that of a fixed frequency oscillator 29 in a mixer 30. The mixer 30 produces at its output only the difference between the output frequencies of those oscillators which in turn is fed to one of the inputs of a second phase comparator 32, through a band pass filter 31. The other input of the phase comparator 32 receives the output of the first variable frequency oscillator 22. The output of the phase comparator 32 is fed back through a second filter 33 to a second variable frequency oscillator 28. The output frequency of the second variable frequency oscillator 28 is so controlled that the output frequency of the band pass filter 31 is equal to that of the first variable frequency oscillator 22. Incidentally, for the fixed frequency oscillator 29, a high stable quartz-crystal oscillator, for example, may be employed.

Reference numeral 34 denotes a modulating signal source for producing a modulating signal by which the output signal from the fixed frequency oscillator 29 is frequency-modulated. For example, when the modulating signal is a voice signal, the frequency of the signal from the signal source 34 ranges roughly from 300 to 3000 Hz. It will be understood that, in the modulation system of the present invention, the frequency of the input signal to the second phase comparator 32 may be set much higher than of the modulating signal, and thus the cut-off frequency of the filter 33 may also be set high. Therefore, physical components in the second phase synchronizing circuit 21, for example, the fixed frequency oscillator 29, may be frequency-modulated. When the frequency-modulated wave is fed to the mixer 30 from the oscillator 29, it is apparent that the frequency-modulated wave 35 is obtained from the second variable frequency oscillator 28.

Let us consider now the case of a series of FM waves with center frequencies 50 MHz + $N \times$ 10 KHz, where $N$ is an integer, i.e., the center frequency of each channel is stepped up by 10 KHz from the first channel. In this case, assume that the signal from the modulating signal source 34 has the frequency ranging from 300 to 3000 Hz (voice frequency band). For simplicity, the frequency of the output of the fixed frequency oscillator 29 is assumed to be fixed at 48 MHz. In other words, the case is that the output of the oscillator 29 is not modulated. Under this condition, in order to obtain the output frequencies of the second variable frequency oscillator 28, 50 MHz + $N \times$ 10 KHz for respective channels, it will be easily understood that the output frequencies of the first variable frequency oscillator 22 must be 2 MHz + $N \times$ 10 KHz for respective channels where $N$ is an integer. Here, if the frequency of the output of the reference frequency oscillator 24 is selected 10 KHz, the division ratio of the frequency divider 23 must be 201 for the first channel and 202 for the second channel. If the division ratio of the frequency divider 23 is set up 202 for the second channel, the output frequency of the first variable frequency oscillator 22 becomes 2.02 MHz after a predetermined time elapses. At the same time, the output frequency of the second variable frequency oscillator 28 is 50.02 MHz for the first channel which provides 2.02 MHz difference therof to 48 MHz and fixed at the same.

Assume now that the output frequency of the fixed frequency oscillator 29 is modulated by the voice signal. In this case, the signal after passed the band pass filter 31 through the mixer 30 is a frequency-modulated signal, i.e., FM signal, having the center frequency represented by 2 MHz + 0.01 $\times$ $N$ MHz, where $N$ corresponds to the channel number. Since the FM signal has the center frequency much higher than the voice frequency, it has little modulation distortion. The FM signal and the output frequency 2.02 MHz (for the second channel) of the first variable frequency oscillator 22 which is stabilized in the first phase cynchronizing circuit 20 are compared in phase in the second phase comparator 32. The output signal from the phase comparator 32 which is proportional to the frequency deviation of both inputs to the second phase comparator 32, is fed back to the second variable frequency oscillator 28. The fedback output signal is used for biasing the reactance elements, for example, in the second variable frequency oscillator. As a result, the FM signal having a center frequency of 50.02 MHz (for the second channel) is produced from the oscillator 28.

The division ratio of the frequency divider 23 may be fixed at the desired channel or may be set variably so as to permit the channel to be changed.

Various other modifications of the disclosed embodiment will become apparent to the person skilled in the art without departing from the spirit and scope of the invention as defined by the appended claims.

What we claim is:

1. A frequency modulation system comprising:
   first means including a first variable frequency oscillator, a frequency divider for frequency dividing the output frequency of said first variable frequency oscillator, a reference frequency oscillator, and a first feedback circuit in which the output frequency of said reference frequency oscillator is compared in phase with that of said frequency divider and the result of the phase comparing is fed back to said first variable frequency oscillator through a first filter for controlling the output frequency of said first variable frequency oscillator;
   second means including a second variable frequency oscillator, a fixed frequency oscillator, means in which the output frequencies of said second variable frequency oscillator and of said fixed frequency oscillator are mixed in a mixer thereby to obtain a difference frequency between said both frequencies, and a second feedback circuit in which said difference frequency is compared in phase with the output frequency of said first variable frequency oscillator and the result of the phase comparing is fed back to said second variable frequency oscillator through a second filter for controlling the output frequency of said second variable frequency oscillator; and
   third means in which the output frequency of said fixed frequency oscillator is frequency-modulated by the frequency of a modulating signal thereby to obtain a frequency-modulated wave from said second variable frequency oscillator.

2. A frequency modulation system according to claim 1, in which said frequency divider includes means for changing the frequency division ratio.

3. A frequency modulation system according to claim 1, in which the output frequency of said first variable frequency oscillator is higher than the maximum output frequency of said modulating signal.

4. A frequency modulation system according to claim 1, in which said fixed frequency oscillator is a quartz crystal oscillator.

5. A frequency modulation system according to claim 1, in which output frequency of said mixer is applied to said second phase comparator through a band pass filter.

* * * * *